(12) United States Patent
Stephenson et al.

(10) Patent No.: US 6,236,442 B1
(45) Date of Patent: May 22, 2001

(54) METHOD OF MAKING LIQUID CRYSTAL DISPLAY HAVING PATTERNED CONDUCTIVE IMAGES

(75) Inventors: Stanley W. Stephenson, Spencerport; Charles D. DeBoer, Palmyra, both of NY (US); Christopher M. Colice, Saint Paul, MN (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/146,656

(22) Filed: Sep. 3, 1998

(51) Int. Cl.[7] .................................................. G02F 1/13
(52) U.S. Cl. ............................................. 349/142; 349/187
(58) Field of Search .................................. 349/106, 142, 349/139, 2, 187; 438/30

(56) References Cited

U.S. PATENT DOCUMENTS 4,435,047  3/1984  Fergason .
5,187,601 * 2/1993  Yamazaki et al. .
5,695,682  12/1997  Doane et al. .

FOREIGN PATENT DOCUMENTS

WO 97/04398  7/1996  (WO) .

OTHER PUBLICATIONS

Hashimoto et al, Reflective Color Display Using Cholesteric Liquid Crystals, SID 98 Digest, pp. 897–900.

* cited by examiner

*Primary Examiner*—Kenneth Parker
(74) *Attorney, Agent, or Firm*—Raymond L. Owens (57) ABSTRACT

A display for presenting selected images to a viewer, including a transparent substrate; a transparent, electrically conductive coating formed over the transparent substrate; a light modulating layer formed over the transparent, electrically conductive layer; and a patterned conductive layer formed over the light modulating layer which provides viewable and conductive images, the light modulating layer being effective in two conditions, in a first condition to prevent the viewing of the viewable and conductive images and in a second condition to permit the viewing of the viewable and conductive images.

9 Claims, 7 Drawing Sheets

METHOD OF MAKING LIQUID CRYSTAL DISPLAY HAVING PATTERNED CONDUCTIVE IMAGES

CROSS REFERENCE TO RELATED APPLICATIONS

Reference is made to commonly-assigned U.S. patent application Ser. No. 08/961,059 filed Oct. 30, 1997, entitled "Display Apparatus Using Light Patternable Conductive Traces" by Stanley W. Stephenson; U.S. patent application Ser. No. 08/961,056 filed Oct. 30, 1997, entitled "Single Sheet Display Having Patternable Conductive Traces" by Stanley W. Stephenson; U.S. patent application Ser. No. 08/990,891 filed Dec. 15, 1997, entitled "Method of Producing a Display Having Patternable conductive Traces" by Stanley W. Stephenson; U.S. patent application Ser. No. 08/990,853 filed Dec. 15, 1997, entitled "A Sheet Having Patternable Conductive Traces for Use in a Display" by Stanley W. Stephenson; U.S. patent application Ser. No. 09/027,321 filed Feb. 20, 1998, entitled "Selectively Presenting Viewable and Conductive Images" by Stanley W. Stephenson and U.S. patent application Ser. No. 09/045,016 filed Mar. 20, 1998, entitled "Selectively Presenting Viewable and Conductive Images" by Stanley W. Stephenson, the disclosures of which are incorporated herein by reference.

FIELD OF THE INVENTION

The field of invention pertains to image displays which can selectively transmit or reflect light.

BACKGROUND OF THE INVENTION

Currently, information is displayed using assembled sheets of paper carrying permanent inks or displayed on electronically modulated surfaces such as cathode ray displays or liquid crystal displays. Other sheet materials can carry magnetically writable areas to carry ticketing or financial information, however magnetically written data is not visible.

A structure is disclosed in PCT/WO 97/04398, entitled "Electronic Book With Multiple Display Pages" which is a thorough recitation of the art of thin, electronically written display technologies. Disclosed is the assembling of multiple display sheets that are bound into a "book", each sheet provided with means to individually address each page. The patent recites prior art in forming thin, electronically written pages, including flexible sheets, image modulating material formed from a bistable liquid crystal system, and thin metallic conductor lines on each page. Various ways are disclosed to produce the conductor lines including photolithography, but not selective exposure and photographic development of traces from a photosensitive emulsion. One disadvantage of this structure is that individual pages are bound together and that many multi-layer conductors must pass across the pages and to an interconnection at the spine of the book.

Fabrication of flexible, electronically written display sheets are disclosed in U.S. Pat. No. 4,435,047. A first sheet has transparent ITO conductive areas and a second sheet has electrically conductive inks printed on display areas. The sheets can be glass, but in practice have been formed of Mylar polyester. A dispersion of liquid crystal material in a binder is coated on the first sheet, and the second sheet is pressed onto the liquid crystal material. Electrical potential applied to opposing conductive areas operate on the liquid crystal material to expose display areas. The display ceases to present an image when de-energized. Currently, Taliq products form electrical interconnection by offsetting the two sheets and contacting trace conductors from each of the two sheets.

The prior art typically requires multiple, separate layers to build up the display. The electrical traces and transparent conductive layers are typically formed through repeated vacuum deposition and photolithography of materials on the substrate. These processes are expensive and require long processing times on capital intensive equipment. Because most display structures are formed of glass, two sheets are used and are offset to permit connection to two separate and exposed sets of traces that are disposed on separate sheets.

The prior art discloses isolating each layer on separate sides of the display, and connecting the traces to drive electronics using solder connections, wire bonds or pressure contact. Such connections do require that both sets of traces be exposed on a surface for the connection process. The uniform, multi-layer structure prevents connection to the inner conductive layer.

In the case of electronic display means, power must be provided to view images. Printed sheets receive ink and cannot be rewritten. In the case of magnetically written media such as magnetic areas on the back of credit cards, the information is not readable.

SUMMARY OF THE INVENTION

Accordingly, it is an object of the present invention to provide a display apparatus which can be rewritten while overcoming the above noted problems.

Another object of the present invention is to provide a display device that can be formed using coating techniques.

This object is achieved in a display for presenting selected images to a viewer, comprising:

(a) a transparent substrate;

(b) a transparent, electrically conductive coating formed over the transparent substrate;

(c) a light modulating layer formed over the transparent, electrically conductive layer; and (d) a patterned conductive layer formed over the light modulating layer which provides viewable and conductive images, the light modulating layer being effective in two conditions, in a first condition to prevent the viewing of the viewable and conductive images and in a second condition to permit the viewing of the viewable and conductive images.

The disclosed structure has the advantage of providing a reflective display using a laser patternable conductive evaporated coating over a liquid crystal, light modulating layer. A laser patternable evaporated coating is inexpensive when deposited over a liquid crystal-polymer coating created using current photographic coating technology. The display can be patterned using laser to create a display. A single large substrate of material can be coated and formed into different types of displays by exposing the light sensitive material to different patterns. Another advantage is that the display can be formed as sheets using coating methods instead of bonding methods.

BRIEF DESCRIPTION OF THE DRAWINGS

FIG. 6B is a magnified view of the completed display of FIG. 5a;

DETAILED DESCRIPTION OF THE PREFERRED EMBODIMENT

Figure 1A:
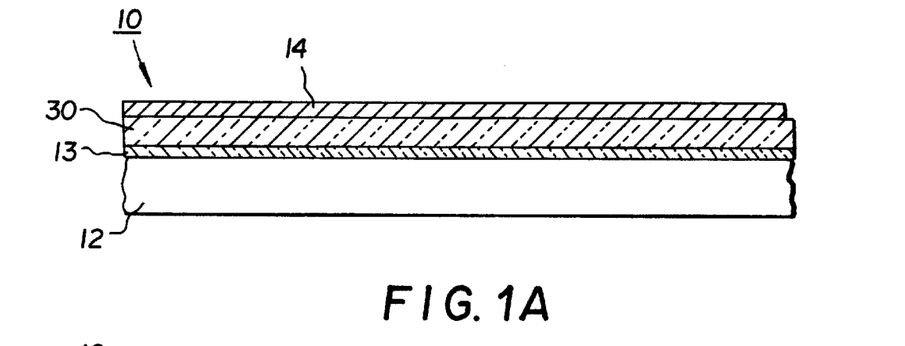
FIG. 1A is a sectional view of display prior to complete processing in accordance with the present invention.

A sectional view of a display 10 prior to complete processing used in the invention is shown in FIG. 1A. The display 10 includes a substrate 12. Substrate 12 can be made of a transparent polymeric material, such as Kodak Estar film base formed of polyester plastic, and have a thickness of between 20 and 200 microns. In an exemplary embodiment, substrate 12 can be a 80 micron thick sheet of polyester film base. Other polymers, such as transparent polycarbonate, can also be used. An optically transparent, electrically conductive layer 13 is formed over the substrate 12. The transparent, electrically conductive layer 13 can be formed of tin-oxide or Indium-Tin-Oxide (ITO), with ITO being the preferred material. Typically, the transparent, electrically conductive layer 13 is sputtered onto the substrate 12 to a resistance of less than 250 ohms per square.

A light modulating layer 30 is formed over the transparent, electrically conductive layer 13. Light modulating layer 30 can be a liquid crystal of conventional design. The liquid crystal materials can be nematic (undoped) and should exhibit high optical and electrical anisotropy and match the index of refraction of the carrier polymer when the material is electrically oriented. Examples of such nematic materials are Merck BL001, BL005, and BL011.

Light modulating layer can also incorporate a chiral doped nematic liquid crystal such as those disclosed in U.S. Pat. No. 5,695,682. Examples of such materials are Merck BL112 and BL126. Application of fields of various intensity and duration change the state of chiral doped nematic materials from a reflective to a transmissive state. These materials have the advantage of maintaining a given state indefinitely after the field is removed. Other light reflecting or diffusing modulating, electrically operated materials can also be coated such as a micro-encapsulated ferroelectric (FLC) material. The light modulating layer 30 is effective in two conditions, which will be described in more detail below.

In one embodiment, a liquid crystal material is homogenized in a polymeric binder such as de-ionized gelatin or polyvinyl alcohol (PVA). Emulsions have been made having binder concentrations of between 10 to 50 percent. Such compounds are machine coatable on equipment associated with photographic films. It is important that the binder have a low ionic content. The presence of ions in such a binder hinders the development of an electrical field across the dispersed liquid crystal material. Additionally, ions in the binder can migrate in the presence of an electrical field, chemically damaging the light modulating layer 30. The liquid crystal and gelatin emulsion is coated to a thickness of between 5 and 30 microns to optimize light modulating of light modulating layer 30. The coating thickness, size of the liquid crystal bubbles and concentration of the bubbles of liquid crystal materials is designed to either diffuse or reflect light.

A patternable conductive layer 14 is evaporated over light modulating layer 30. In one example, platinum oxide was sputtered over a liquid crystal-gelatin emulsion approximately 7 microns thick. The patternable conductive layer 17 formed a metallic layer of conductivity sufficient to carry a charge to operate on the light modulating layer 30. Other commonly used materials and processes can be used to provide a vacuum deposited coat to create patternable conductive layer 14. In a vacuum environment, materials such as aluminum, tin, silver, platinum, carbon, tungsten, molybdenum or Indium can be used. Oxides of said metals can be used to darken patternable conductive layer 14. The metal material in the vacuum chamber can be excited by energy from resistance heating, cathodic arc, electron beam, sputtering or magnetron excitation. The use of Tin-Oxide or Indium-Tin Oxide permits coatings of patternable conductive coating 17 that are transparent. An ITO coating can be formed over light modulating layer 30 that has less than 250 ohms per square of resistance and high light transmission.

Figure 1B:
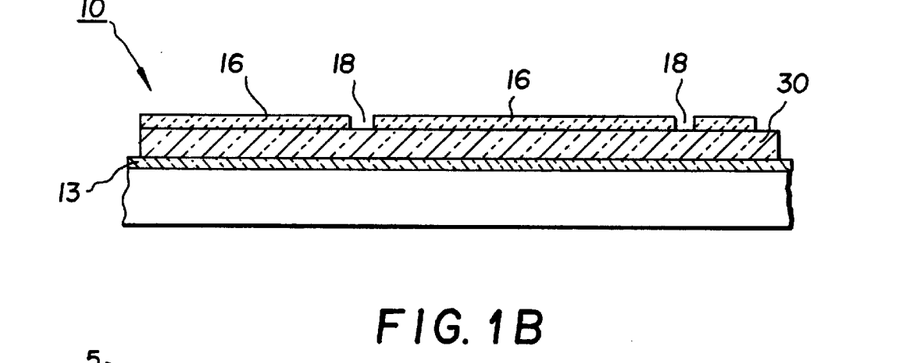
FIG. 1B is a sectional view of the structure of FIG. 1A after processing.

FIG. 1B is a sectional view through the display 10 after laser processing. The patternable conductive layer 14 has been laser scribed create viewable and conductive images 16 and non-conductive areas 18, as shown in FIG. 1B. The effective conductivity of the viewable and conductive images 16 is less than 250 ohms per square. Viewable and conductive images 16 appear black, having an optical density of greater than 2.0 D. Nominally conductive metal in non-conductive areas 18 has been removed using a Yttrium-Aluminum Garnet (YAG) laser to define the extent of viewable and conductive images 16. Non-conductive areas 18 are typically gaps approximately 25–100 microns wide that electrically isolate electrically viewable and conductive images 16. The YAG laser can generate patterns in patternable conductive layer 14 for both opaque and transmissive coatings of materials.

Prior art disclosed the use of an adhesive to bond a patterned conductive layer 17 over light modulating layer 30. In one experiment, an adhesively bonded display required 30 volts to clear light modulating layer 30. A second display with an identical light modulating layer 30 was vacuum coated with platinum oxide to create patternable conductive layer 14. A YAG laser created patterned indicia in patternable conductive layer 14. The drive voltage required to clear light modulating layer 30 was under one volt. The evaporated metallic coating over light modulating layer 30 has a lower drive voltage than an adhesively bonded patternable conductive layer 14.

Figure 1C:
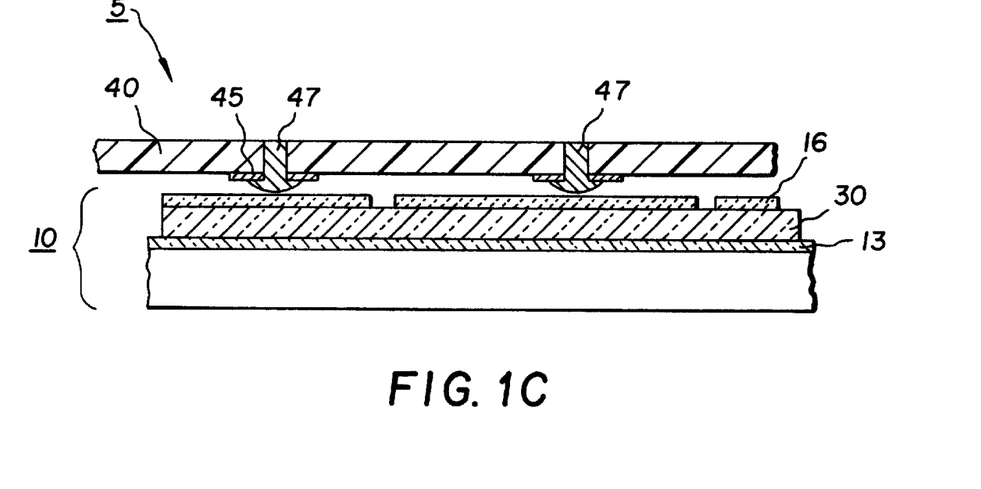
FIG. 1C is a sectional view of the structure of FIG. 1A connected to a circuit board to form the display in accordance with the present invention.

The transparent, electrically conductive layer 13 provides a continuous electrode across light modulating layer 30. An electrical field across viewable and conductive images 16 and transparent, electrically conductive layer 13 operates on light modulating layer 30 to change light transmission to viewable and conductive images 16. FIG. 1C is a section view of processed display 10 connected to circuit board 40 to form a display 10. Circuit board 40 has a series of traces that are connected to viewable and conductive images 16 through contact pads 47.

It will be appreciated by those skilled in the art that the present invention is suitable for use as a privacy screen. For example it can be placed over a bathroom window and in a driven condition can be transparent and in an undriven condition can be opaque. In such a case the layers 13 and 14 need not be patterned. It is a feature of the present invention that the display 10 can be formed as a sheet. In this case the display 10 is either transparent or opaque and does not need to present viewable images.

Patternable conductive layer 14 can be soft, in which case, connection between circuit board 40 and patternable conductive layer 14 must be done without damaging viewable and conductive images 16. In one case, Indium powder is deposited between circuit board 40 and patternable conductive layer 14 and the two components are heated to melt the indium and form an electrical connection between circuit board 40 and patternable conductive layer 14. In another case, an electrically conductive adhesive is used to form connection between circuit board 40 and patternable conductive layer 14.

External drive circuitry of conventional design (not shown) selectively drives viewable and conductive images 16 to change optical properties of selected drive segments of display 10. The light modulating layer 30 is effective in two conditions. In a first condition, the light modulating layer 30 prevents the viewing of the viewable and conductive images 16, and in a second condition, the light modulating layer 30 permits the viewing of the viewable and conductive images 16.

When using nematic materials, an alternating voltage is applied to transparent, electrically conductive layer 13 to provide an electrical field across viewable and conductive images 16 that are electronically grounded. Using an alternating voltage across light modulating layer 30 prevents the damage from migration of ions within and between any of the layers. A frequency of greater than 60 cycles per second in the alternating voltage is sufficient to orient molecules in the light modulating layer 30. In another case, transparent patternable conductive layer 14 is not patterned, and provides a continuous translucent sheet that can be electrically driven to a transmissive state to create an electrically cleared privacy screen.

When light modulating material 30 is a chiral nematic material having memory properties, a ground signal is applied to transparent, electrically conductive layer 13, and selected viewable and conductive images 16 are operated on through traces 45 to drive the image areas to either a reflective or transmissive state. In one case, patternable conductive layer 14 is an evaporated metal oxide which creates a dark background that absorbs light. In a second case, patternable conductive layer 14 is an electrically conductive, light transmissive coating of Indium Tin Oxide.

Figure 7A:
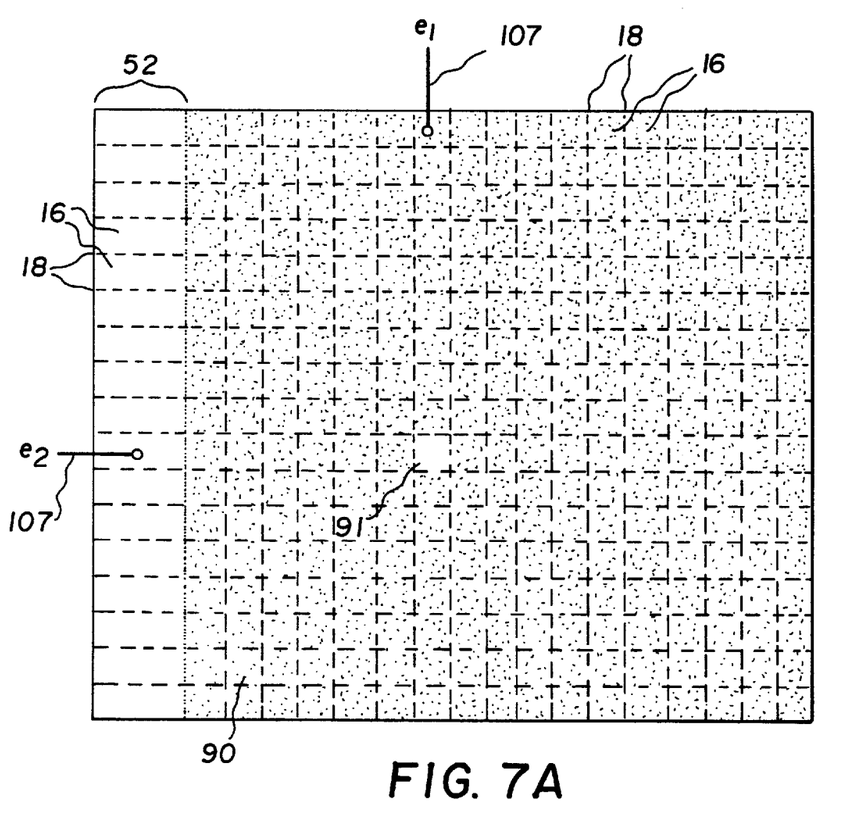
FIG. 7A is top view of a patterned reflective display.
Figure 7B:
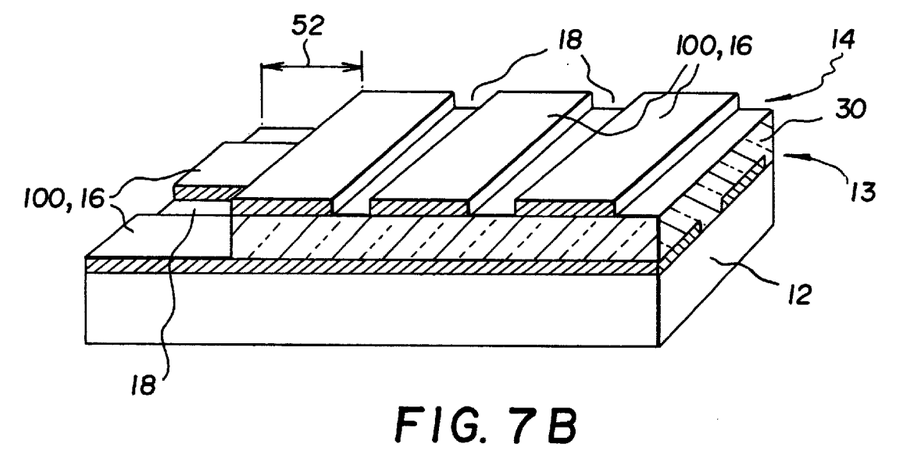
FIG. 7B is an isometric magnified view of the patterned reflective display of FIG. 7A.

In another application, shown in FIG. 7A and FIG. 7B, viewable and conductive images 16 become laser formed conductive traces 100, which are formed between non-conductive areas 18 to create conductive traces 100. Transparent, electrically conductive layer 13 is laser scribed in a first direction. Light modulating layer 30 coated over transparent, electrically conductive layer 13. Patternable conductive layer 14 is then coated over light modulating layer 30. Patternable conductive layer 14 is laser scribed to form non-conductive areas 18 between conductive traces 100. Coatings over transparent, electrically conductive layer 13 are removed to expose conductive traces 100 in transparent, electrically conductive layer 13. Conductive traces 100 are disposed across display 10 orthogonally to create pixels 90 at intersections of traces 100. Coatings over transparent, electrically conductive area 13 are removed from connection area 52 to permit connection to individual traces formed in transparent, electrically conductive layer 13.

A signal (e1–e2) applied across pairs of traces from each of the two electrically conductive layers permits operation on a given pixel element. In order to activate the pixels 90, voltage is applied using electrical leads 101, two of which are shown. There is a lead 101 attached on the connection area 52 to every row and there is a lead 101 attached to every column on the patternable conductive layer 14. As shown in FIG. 7A, an activated pixel 91 is driven by the two leads 101 visible in FIG. 7A. By activating pixels 90 in a selected fashion, an image can be formed on the display 10. Please note that FIG. 7A is not to scale.

Figure 2A:
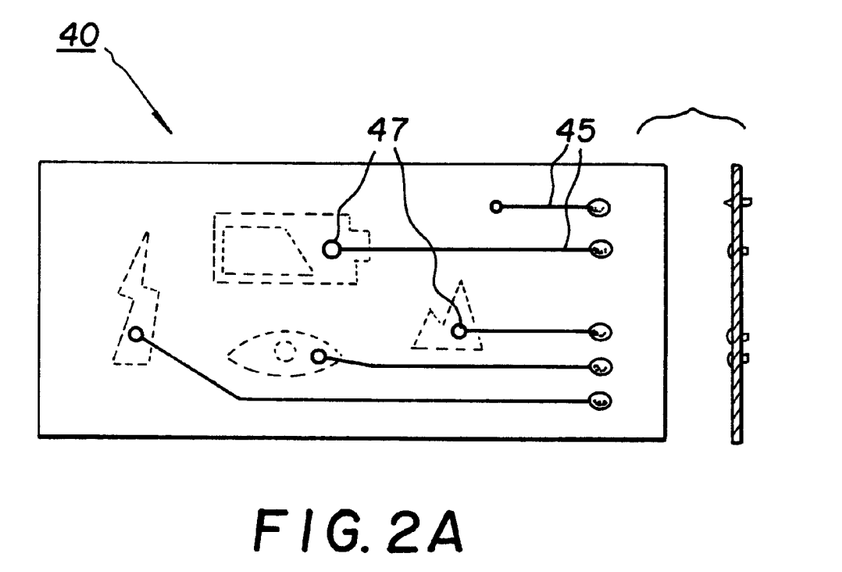
FIG. 2A is a top view of the circuit board of FIG. 1C that is part of the display.
Figure 2B:
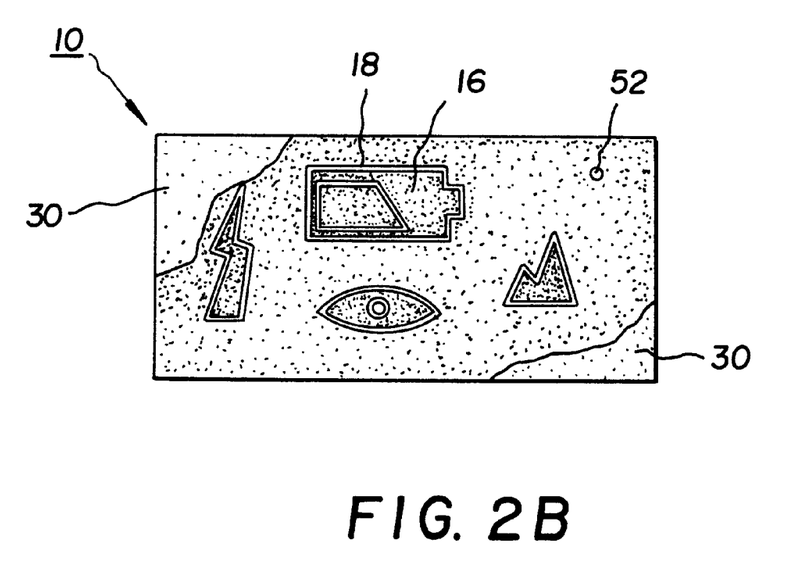
FIG. 2B is a top view with cut away sections of the processed display of FIG. 1B.

FIGS. 2A and 2B show top views of each of the two parts of a display 10. FIG. 2A shows a circuit board 40, which has circuit board traces 45 running from a position under each viewable and conductive image 16. Contact pads 47 are located under each viewable and conductive image 16 and are connected to each conductive trace 45 to provide electrical interconnect to each viewable and conductive image 16 on display 10. FIG. 2B is a top view of display 10 with light modulating layer 30 sectioned away to show viewable and conductive images 16. The patternable conductive layer 14 in the display 10 has been laser scribed to create viewable and conductive images 16. Non-conductive areas 18 serve to electrically isolate viewable and conductive images 16. A power pin 50 contacts a connection area 52, which has been laser scribed to expose transparent, electrically conductive layer 13. Multiple power pins 50 connected to multiple connection areas 52 can be used to ensure a uniform field across the transparent, electrically conductive layer 13.

Figure 3A:
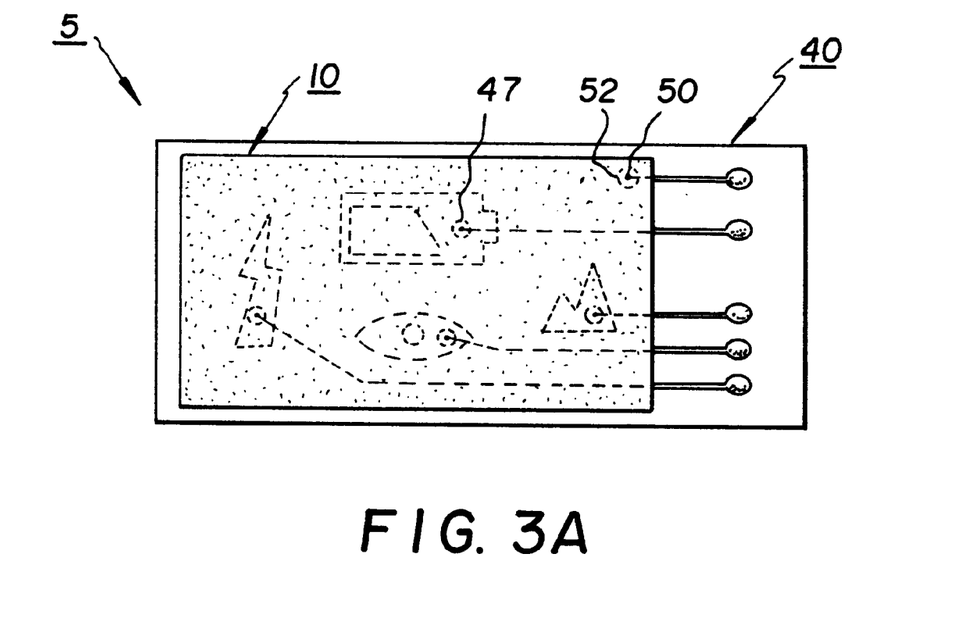
FIG. 3A is a top view of the completed display in an inactivated condition.
Figure 3B:
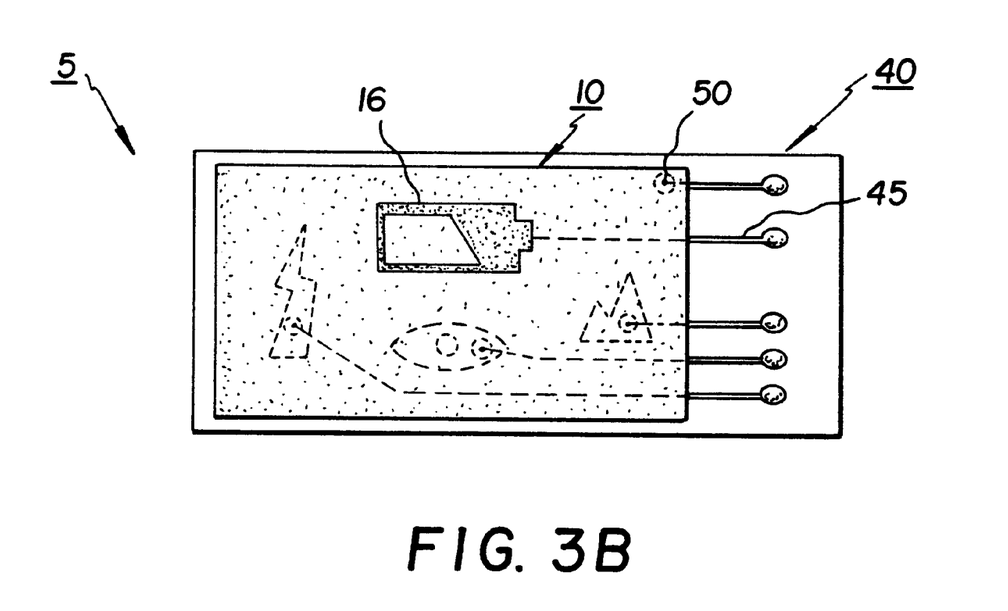
FIG. 3B is a top view of the completed display with an activated segment.

Top views of display 10 are shown in FIGS. 3A and 3B. Circuit board 40 has a set of circuit board traces 45 that provide interconnection to external drive electronics (not shown). Each circuit board trace 45 terminates under a separate viewable and conductive image 16. Contact pads 47 press against each viewable and conductive image 16.

In FIG. 3A, which shows an inactivated state, viewable and conductive images 16 are obscured by light modulating layer 30 which reflects light from absorption by the viewable and conductive images 16. Power pin 50 continuously supplies an alternating voltage through connection area 52 to transparent, electrically conductive layer 13. FIG. 3B shows the activation of one area of display 10. A circuit board trace 45 has a first electrical potential switched to ground. The circuit board trace 45 carries the ground potential to contact pad 47 (shown in FIG. 3A) and into viewable and conductive image 16. Power pin 50 supplies an alternating voltage to the transparent, electrically conductive layer 13 on the other side of light modulating layer 30.

In one embodiment, patternable conductive layer 14 is a sputtered coating of transparent Indium-Tin-Oxide. Circuit board 40 is attached to a single patternable area 14 at the edge of display 10. Light modulating layer 30 is a conventional nematic liquid crystal material that creates an translucent privacy screen. Power pin 50 can be acted on to supply an alternating voltage to transparent, electrically conductive layer 13. Application of the alternating current field clears light modulating layer 30. The use of a sputtered transparent conductor over the light modulating layer 30 provides a simple, energy efficient method of providing a field across clearing light modulating layer 30 without a second sheet.

Figure 4A:
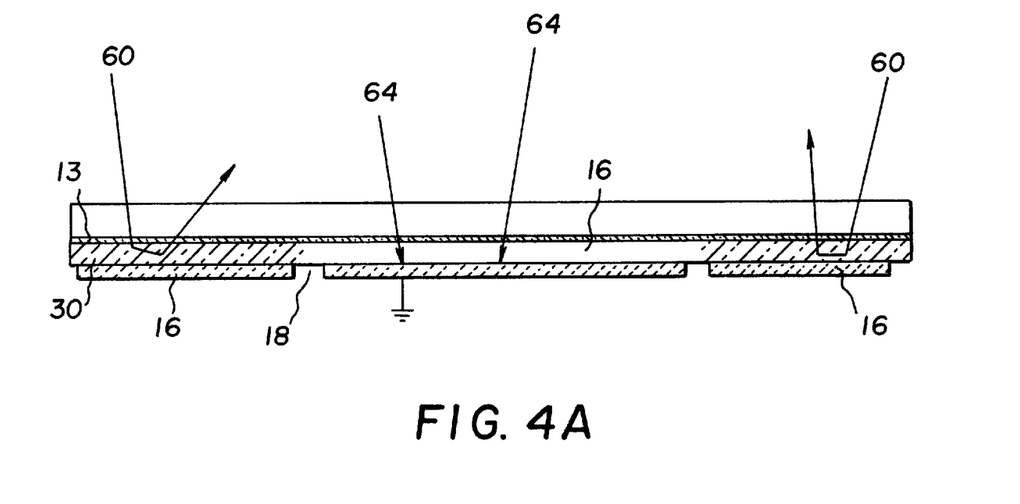
FIG. 4A is a sectional view showing light striking segments of diffusing display.

FIG. 4A is a sectional view showing the optical operation of a diffusing display 10 in non-operating and operating mode. An alternating voltage is supplied through power pin 50 to the transparent, electrically conductive layer 13. In the center, a ground signal is applied to viewable and conductive image 16. The applied alternating voltage across light modulating layer 30 causes the liquid crystal material to align with the imposed electrical field. The area of light modulating layer 30 over viewable and conductive image 16 becomes transparent and viewable and conductive image 16 absorbs absorbed light 64. The black conductive material from patternable conductive layer 14 absorbs light in the viewable and conductive image 16, causing the displayed area to appear black in a white background. One each side, a viewable and conductive image 16 is not grounded and no voltage exists between viewable and conductive image 16 and the transparent, electrically conductive layer 13. Light modulating layer 30 reflects light striking display 10 back as reflected light 60, creating a "white" image.

Figure 4B:
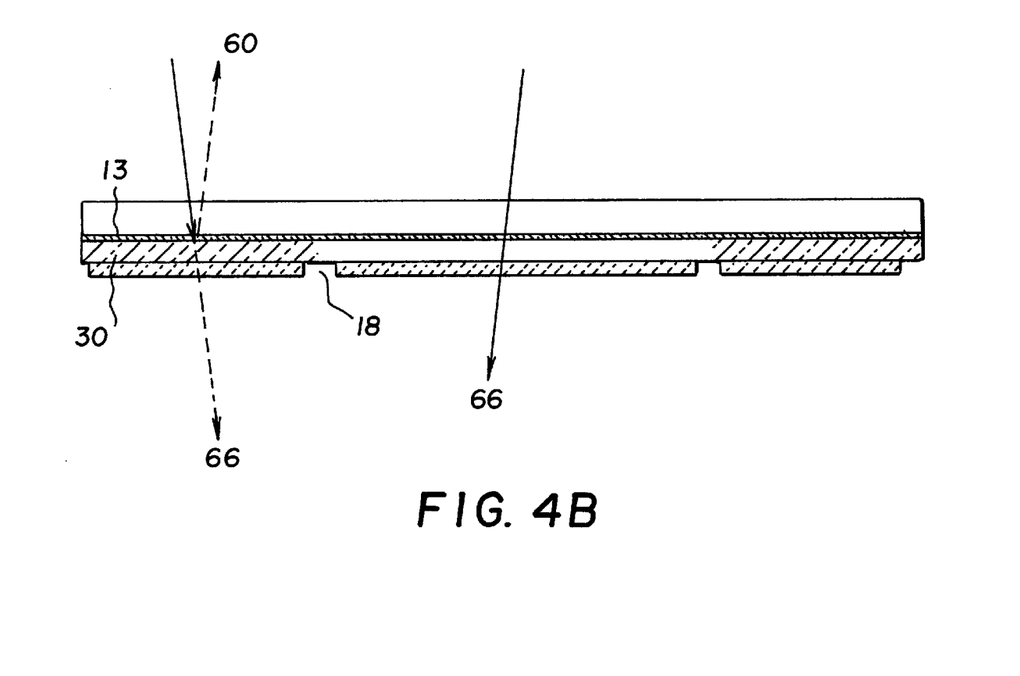
FIG. 4B is a sectional view showing light striking segments of a reflecting display.

FIG. 4B is a sectional view showing the optical operation of a reflecting display 10 in non-operating and operating mode. A ground voltage is supplied through power pin 50 to the transparent, electrically conductive layer 13. In the center, a signal is applied to viewable and conductive image 16. Viewable and conductive image 16 in this case is a transparent, electrically conductive coating of Indium-Tin-Oxide. A YAG laser has been used to remove ITO material in non-conductive areas 18. A drive signal has been applied to across light modulating layer 30 to cause a chiral nematic liquid crystal material to become transparent. Transparent light modulating layer 30 over viewable and conductive image 16 transmits transmitted light 66. A black material can be disposed behind display 10, causing the displayed area to appear black. One either side of the center, a viewable and conductive image 16 is driven to a reflective state. Light modulating layer 30 reflects light striking display 10 back as reflected light 60, creating a "white" image. A chiral nematic material in light modulating area 30 can reflect light at specific, visible wavelengths such as red, green or blue. Reflected light 60 can be a portion of the visible color spectrum, so that some portions of incident light are reflected light 60, while other portions of the spectrum are transmitted light 66.

Individual sheets can be used to create color-black displays, or stacked to create a full color display, as is disclosed in Hashimoto et al., "Reflective Color Display Using Cholesteric Liquid Crystals", SID 98 Digest, Article 31.1, 1998, pp. 897–900. The present invention has the advantage of using coating methods instead of bonding methods.

Figure 5A:
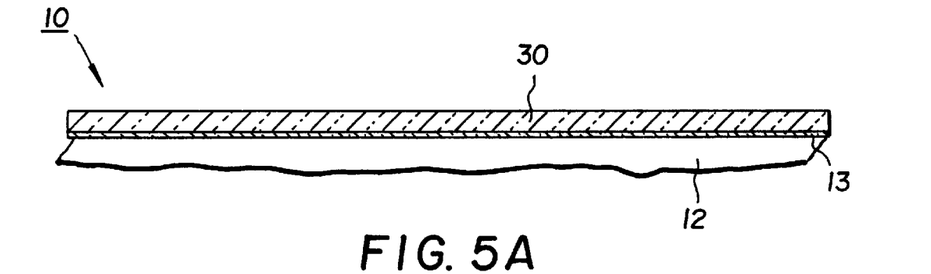
FIGS. 5A–5D show various steps in making a display in accordance with the present invention.

FIGS. 5A–5D are schematic representations of how the viewable and conductive images 16 are formed in the patternable conductive layer 14. In FIG. 5A, a transparent substrate 12 is coated with transparent electrically conductive layer 13 using sputtered Indium-Tin-Oxide. A light modulating layer 30 which includes liquid crystal material in a polymeric binder is coated over transparent, electrically conductive layer 13.

Figure 5B:
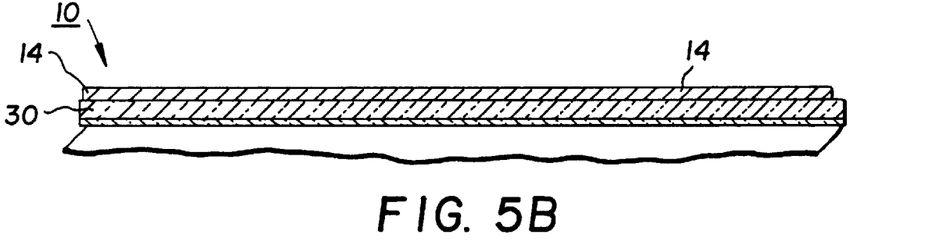
Figure 5C:
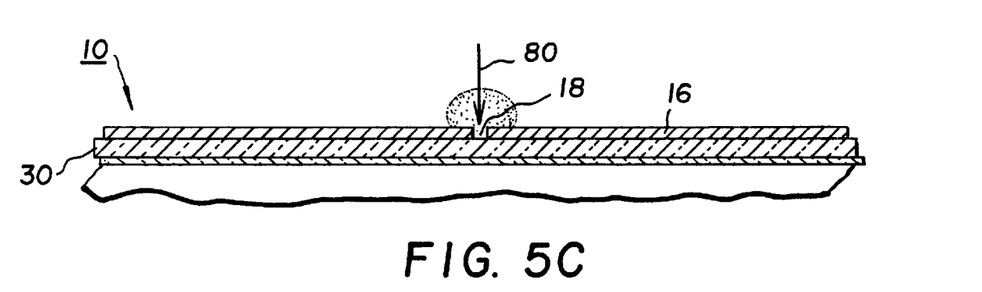

In FIG. 5B, display 10 has a patternable conductive layer 14 such as aluminum or platinum, which has been coated by evaporative techniques over light modulating layer 30. In FIG. 5C, a high powered laser beam 80 from a Ytterium-Aluminum-Garnett (YAG) laser is used to remove portions of patternable conductive layer 14. The laser beam 80 actually scribes the material down and into light modulating layer 30 in a predetermined pattern to form viewable and conductive images 16 which are electrically isolated from each other. The patterning laser can be a 700 series laser head from Lee Laser, Inc. of Orlando, Fla. Such a laser emits light at 1064 nanometers wavelength at up to 25 watts. Experiments have shown that this laser can be operated at 18 amps and 10 kilohertz with a beam diameter of 100 microns and travel at 1000 millimeters per sec and scribe through patternable conductive layer 14. Under the operating conditions, 2.3 Watts of power are used to scribe a 100 micron line at 1000 millimeters per second.

In another case, a conventional photosensitive etch resist material is applied over the surface of patternable conductive layer 14. Actinic radiation is used to selectively polymerize the etch resist material into an etch resistant state. An acid etch is applied for a time that permits etching through patternable conductive layer 14. Display 10 is then washed in a solvent to remove the etch resist.

Figure 5D:
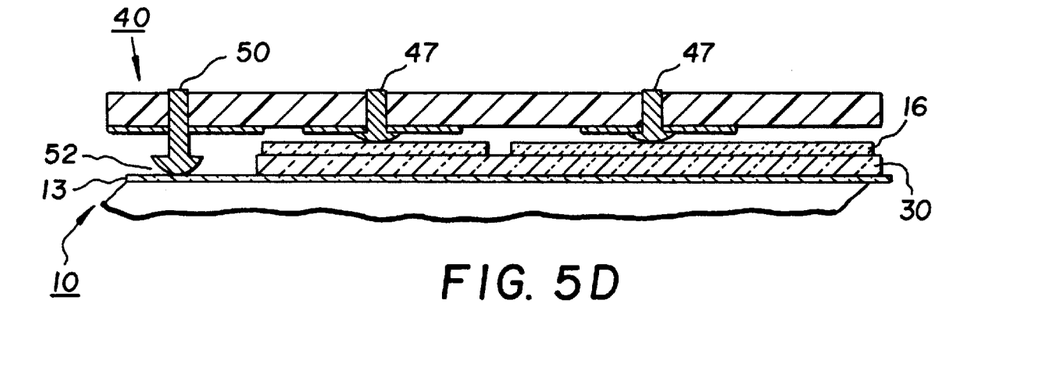

In FIG. 5D, circuit board 40 includes contact pads 47 has been pressed against the viewable and conductive images 16 to provide electrical connections to them. Electrically conductive adhesive material can be used fasten circuit board 40 to the display 10. A power pin 50 formed in the printed circuit board 40 contacts a portion of transparent, electrically conductive layer 13. It should be noted that in an area 52 the patternable conductive layer 14 and light modulating layer 30 have been removed to facilitate direct electrical connection to the transparent, electrically conductive layer 13.

Figure 6A:
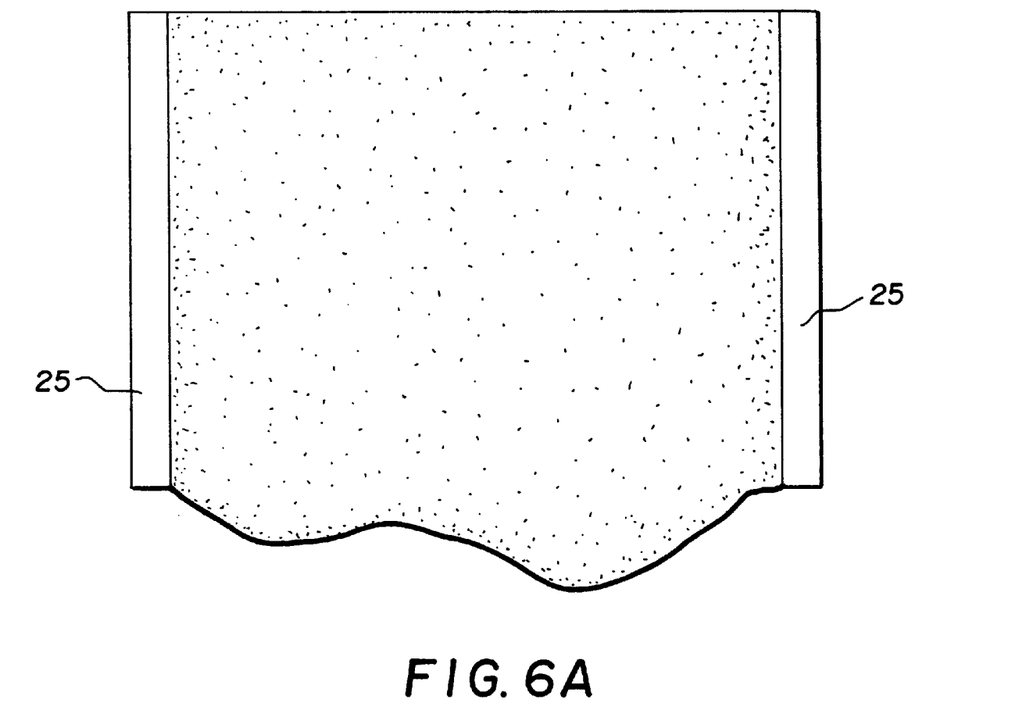
FIG. 6A is a partial top view of the completed display of FIG. 2 as used in a second application.

FIG. 6A is a partial top view of a different application for display 10. Conductive areas 16 and non-conductive areas 18 cover the majority of the sheet, and power areas 25 have been formed on two sides of display 10. Power areas 25 have had all coatings above transparent, electrically conductive layer 13 removed. The overlying layers can be removed by chemical etching. Power areas 25 permit electrical connection to transparent, electrically conductive layer 13.

Figure 6B:
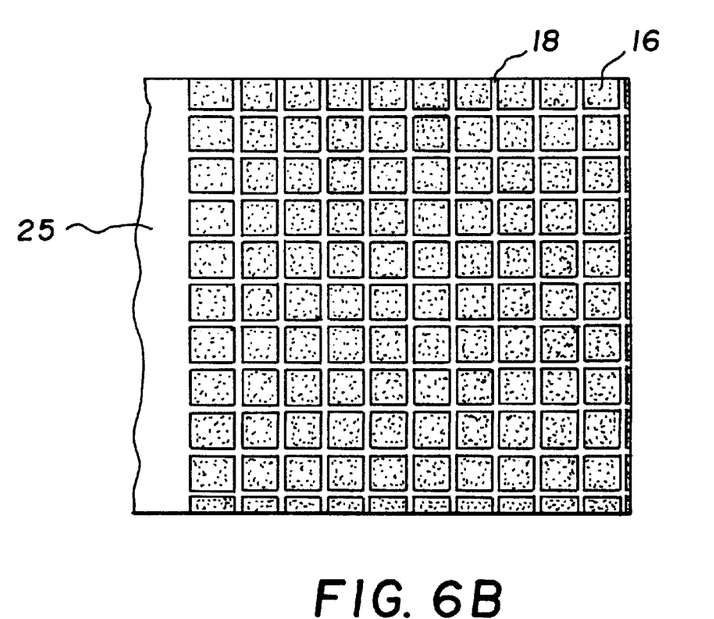

FIG. 6B is a magnified rear view of the surface of display 10. Conductive areas 16 are small conductive pads define pixel elements on display 10. Non-conductive area 18 define a fine conductor-free mesh that limits conductive areas 16. Nonconductive areas 18 are required to limit an electrical field operating between transparent, electrically conductive layer 13 and conductive areas 16. When the light modulating layer 30 is composed of material having state-memory, such as cholesteric liquid crystal, the sheet can be used to form a electrically writable sheet.

The invention has been described in detail with particular reference to certain preferred embodiments thereof, but it will be understood that variations and modifications can be effected within the spirit and scope of the invention.

PARTS LIST 10 display
12 substrate
13 transparent, electrically conductive layer
14 patternable conductive layer
16 viewable and conductive images
17 barrier layer
18 non-conductive areas
25 power areas
30 light modulating layer
40 circuit board 45 circuit board traces
47 contact pad
50 power pin
52 connection area
60 reflected light
64 absorbed light
66 transmitted light
80 laser beam
90 pixels
91 activated pixel
100 conductive traces
101 electrical leads

What is claimed is:

1. A method of forming a display in which images can be selectively presented to a viewer, comprising:
    (a) providing a transparent substrate;
    (b) forming a transparent, electrically conductive coating over the transparent substrate;
    (c) forming a light modulating layer including liquid crystal material in a polymer binder over the transparent, electrically conductive layer;
    (d) forming a metallic conductive layer directly on the light modulating layer and removing selected portions of the metallic conductive layer to provide viewable and conductive images, the light modulating layer being effective in a first condition to prevent the viewing of the viewable and conductive images and in a second condition to permit the viewing of the viewable and conductive images; and
    (e) providing electrical connection so that an electrical field can be applied across selected ones of such viewable and conductive images and the transparent, electrically conductive layer to cause the light modulating layer underlying the selected ones of the viewable and conductive images to change from the first condition to the second condition so as to present such viewable and conductive images for viewing to the viewer.

2. The method of claim 1 wherein the metallic conductive layer is applied by vacuum depositing such metallic conductive layer.

3. The method of claim 2 wherein the vacuum deposition is accomplished by vacuum deposition.

4. The method of claim 2 wherein the metallic conductive layer is removed by scribing portions by a laser light beam.

5. The method of claim 4 wherein the laser light beam is provided by a YAG laser.

6. The method of claim 1 wherein the metallic conductive layer includes indium tin oxide.

7. The method of claim 1 further including the step of electrically connecting the viewable and conductive images to contact pads.

8. A method of forming a display in which images can be selectively presented to a viewer, comprising:
    (a) providing a transparent substrate;
    (b) forming a transparent, electrically conductive coating over the transparent substrate;
    (c) forming a light modulating layer including liquid crystal material in a polymer binder over the transparent, electrically conductive layer;
    (d) forming a metallic conductive layer directly on the light modulating layer and removing by a laser light beam selected portions of the metallic conductive layer to provide viewable and conductive images, the light modulating layer being effective in a first condition to prevent the viewing of the viewable and conductive images and in a second condition to permit the viewing of the viewable and conductive images; and
    (e) providing electrical connection so that an electrical field can be applied across selected ones of such viewable and conductive images and the transparent, electrically conductive layer to cause the light modulating layer underlying the selected ones of the viewable and conductive images to change from the first condition to the second condition so as to present such viewable and conductive images for viewing to the viewer.

9. A method of forming a display in which images can be selectively presented to a viewer, comprising:
    (a) providing a substrate;
    (b) forming an electrically conductive coating over the substrate;
    (c) forming a light modulating layer including liquid crystal material in a polymer binder over the electrically conductive layer;
    (d) forming a conductive layer directly on the light modulating layer and providing viewable and conductive images in the conductive layer and removal of selected areas above the electrically conductive coating to provide viewable and conductive images, the light modulating layer being effective in a first condition to prevent the viewing of the viewable and conductive images and in a second condition to permit the viewing of the viewable and conductive images; and
    (e) providing electrical connection so that an electrical field can be applied across selected ones of such viewable and conductive images and the electrically conductive layer to cause the light modulating layer underlying the selected ones of the viewable and conductive images to change from the first condition to the second condition so as to present such viewable and conductive images for viewing to the viewer.

* * * * *